United States Patent
Washiya et al.

(10) Patent No.: US 8,916,476 B2
(45) Date of Patent: Dec. 23, 2014

(54) MICROFINE STRUCTURE FORMATION METHOD AND MICROFINE STRUCTURE FORMED BODY

(71) Applicant: Hitachi Media Electronics Co., Ltd., Yokohama-shi, Kanagawa (JP)

(72) Inventors: Ryuta Washiya, Tokyo (JP); Masahiko Ogino, Tokyo (JP); Shiro Nagashima, Yokohama (JP); Akio Yabe, Yokohama (JP); Masaki Sugita, Yokohama (JP); Akihiro Miyauchi, Tokyo (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 0 days.

(21) Appl. No.: 14/085,179

(22) Filed: Nov. 20, 2013

(65) Prior Publication Data

US 2014/0231965 A1 Aug. 21, 2014

(30) Foreign Application Priority Data

Feb. 18, 2013 (JP) ................................. 2013-028529

(51) Int. Cl.
*H01L 21/311* (2006.01)
*H01L 21/308* (2006.01)
*H01L 29/06* (2006.01)

(52) U.S. Cl.
CPC ........ *H01L 21/3088* (2013.01); *H01L 21/3086* (2013.01); *H01L 21/31144* (2013.01); *H01L 29/0657* (2013.01)
USPC ............ 438/703; 438/694; 438/699; 438/702

(58) Field of Classification Search
USPC .................................. 438/694, 699, 702, 703
See application file for complete search history.

(56) References Cited

FOREIGN PATENT DOCUMENTS

| JP | 2004-351693 A | 12/2004 |
| JP | 2009-158729 A | 7/2009 |
| JP | 2012-041521 A | 3/2012 |

*Primary Examiner* — Tan N Tran
(74) *Attorney, Agent, or Firm* — Volpe and Koenig, P.C.

(57) ABSTRACT

Provided are a method for forming a microfine structure and a microfine structure forming body prepared by the method. The method allows a remaining film part to be formed thinner and more uniform on a substrate than the conventional techniques. The method comprises the steps of: forming an oxide layer on a metallic thin film; a photocurable resin layer via first and second adhesive layers over the oxide layer; and transferring a microfine structure formed on a mold by pressing the mold onto the photocurable resin layer. The first adhesive layer includes a compound having at least two hydrolysable functional groups, and the second adhesive layer includes a compound having at least a hydrolysable functional group and a reactive functional group.

8 Claims, 3 Drawing Sheets

MICROFINE STRUCTURE FORMATION METHOD AND MICROFINE STRUCTURE FORMED BODY

CROSS REFERENCE TO RELATED APPLICATIONS

This application claims the foreign priority benefit under Title 35, United State Code, 119 (a)-(d) of Japanese Patent Application No. 2013-028529, filed on Feb. 18, 2013 in the Japan Patent Office, the disclosure of which is herein incorporated by reference in its entirety.

BACKGROUND OF THE INVENTION

1. Field of the Invention

The present invention relates to a method for forming a microfine structure comprising a metal on a substrate, and a microfine structure forming body formed by the method.

2. Description of Related Art

Recently, photolithography techniques have been used frequently for processing a microfine pattern required for semiconductor devices, etc. However, it has become difficult to process such a microfine pattern by the photolithography techniques, as the formation of extremely small patterns has progressed, and the required pattern dimension has nearly reached a wavelength of light used in an exposure process. To obtain an even higher accuracy, an electron beam lithography apparatus, which is a charged particle beam apparatus, has been used instead of a photolithography apparatus.

While a pattern formation method (or a photolithography method) using a light source such as an i-beam and an excimer laser is a one-shot exposure method, a pattern formation method using the electron beam lithography apparatus is a direct drawing method (or an electron beam writing method) using a mask pattern. Therefore, there is a disadvantage in the electron beam writing method in which increase in an exposure time (or drawing time) requires a longer time for completing the pattern formation as the number of patterns to be drawn increases. As a result, the higher a degree of integration of a semiconductor integrated circuit becomes, the longer a time required for the pattern formation increases, which raises concerns on reduction of the throughput.

Hereby, to speed up the pattern formation using an electron beam lithography apparatus, a batch graphic irradiation method has been developed, in which electron beams are irradiated in one-shot to combined masks in various shapes, so as to form more complicatedly shaped electronic beams. However, the pattern formation by the batch graphic irradiation method has been resulted in inevitably large-sized apparatus of such an electron beam lithography apparatus and requirement for control in high accuracy of mask alignment. This causes a disadvantage that the apparatus cost increases.

In contradiction to the above, a nanoimprint technology is well known as a technology for forming a fine pattern at low cost. In this nanoimprint technology, the fine pattern can be formed on a resin layer of a transferred object by pressing the stamper having a concavity and convexity (a surface configuration) by using the electron beam lithography technique or the photolithography technique, etc. corresponding to a concavity and convexity of a pattern to be formed against, for example, a transferred object obtained by forming a resin layer on a predetermined substrate. According to such a nanoimprint technology, a fine pattern of a stamper can be transferred to a resin layer.

Further, in the nanoimprint technology, etching on a substrate by a pattern transferred onto a resin layer of the substrate as a resist mask allows a pattern corresponding to the transferred pattern to be formed on the surface of the substrate.

This nanoimprint technology may be applied to the formation of a memory bit in a large volume storage medium, and the pattern formation in a semiconductor integrated circuit.

In the meantime, a structure of pattern transferred onto a resin layer on the substrate by such a nanoimprint technique, is different from a structure of a resist pattern formed by the conventional photolithography technique. That is, the structure of the resist pattern made by the conventional photolithography is formed from only the part to be a mask. On the contrary, the structure of the transferred pattern onto the resin layer by the nanoimprint technique, consists of a convex part formed on the resin layer corresponding to the concave part of the stamper and a concave part formed on the resin layer corresponding to the convex part of the stamper. A thin film layer consisting of the resin remains on the substrate in the concave part formed on the resin layer. Hereinafter, this thin film layer may be referred to as "remaining film part".

When a pattern of recording bits for a large capacity or a pattern of a semiconductor integrated circuit is created on the substrate, the aforementioned remaining film part and the surface of the substrate covered by the remaining film part are etched using the aforementioned film on the convex part of the resin layer transferred by the nanoimprint technique as an etching mask. According to these methods, a pattern corresponding to the pattern transferred onto the resin layer is formed by etching a part of the substrate corresponding to the concave part of the resin layer.

Note the etching accuracy of the substrate part is affected by the thickness distribution of the remaining film part in the direction along the substrate plate. More specifically, for example, provided etching of 50 nm depth is performed to the substrate in which variation of the thickness of the remaining film part has a differentiation of 50 nm with respect to the maximum thickness and minimum thickness, a part of the substrate having a thin remaining film part may be etched, while apart of the substrate having a thick remaining film part may not be etched completely. Therefore, to maintain the desired processing accuracy of etching, a thickness of a remaining film part formed on a substrate has to be thin and uniform.

Further, in order to form a non-defective microfine structure by using the nanoimprint technology, it is important to control the mold-releasability of the resin layer from the stamper. That is, the mutual adhesion in the interface between the stamper and the resin layer is required to be lower than the mutual adhesion in the interface between the substrate and the resin layer.

According to the above reasons, in order to lower the mutual adhesion in the interface between the stamper and the resin layer, some techniques using a fluorine based mold-releasing agent onto the surface of the stamper is known (for example, refer to Japanese Unexamined Patent Application Publication No. 2004-351693). However, the mold-releasability of the stamper from the resin layer begins gradually deteriorating in proportion as the number of repeatable transfer times onto the resin layer increases. The stamper with deteriorated mold-releasability gives rise to deterioration in the pattern to be transferred on the resin layer. The mold-releasing agent can also be treated again after the stamper has been used repeatedly. However, there is a drawback that the cost of the product obtained from the transferred pattern cannot be lowered enough, from a viewpoint of the number of the repeatable transfer times per one time treatment of the mold-releasing agent with maintaining the predetermined transferring quality.

Another method for enhancing the adhesion between the resin layer and the substrate is also known as a method for preventing a pattern defect from occurring (for example, refer to Japanese Unexamined Patent Application Publications No. 2012-41521 and No. 2009-158729).

In a method disclosed in Japanese Unexamined Patent Application Publication No. 2012-41521, a resinous material for making a resin layer is blended with a silane coupling agent or the like, so as to enhance the (mutual) adhesion between the resin layer and the substrate. Further, in a method disclosed in Japanese Unexamined Patent Application Publication No. 2009-158729, a cohesive layer comprising a silane coupling agent is formed between the substrate and the resin layer, thereby enhancing the cohesive between the resin layer and the substrate.

In the meantime, the releasability of the stamper from the resin layer is attributed to the ratio of the aspect (that is height of the pattern/width of the pattern) and the size of the pattern. Specifically, release of the stamper from the resin layer becomes more difficult, as the ratio of the aspect of the pattern becomes larger and the pattern size becomes smaller. When the aspect ratio of the pattern becomes two or more, the convex parts of the transferred pattern in the resin layer are easy to collapse, and the resinous portion corresponding to the convex part is transferred to the stamper, causing a defect in the transferred pattern in the releasing process.

Due to the recent demand for large sizing and high functionalization for a large scale recording medium and semiconductor integrated circuit, etc., it is anticipated that the pattern on the substrate for these devices becomes smaller, and the ratio of the aspect of the pattern to be prepared becomes larger. Therefore, in order to prepare no defect pattern by applying the nanoimprint technique to the manufacturing of such a large scale recording medium and a semiconductor integrated circuit, etc., a nanoimprint technique (that is, method for forming microfine structure) having the following features is desired. Herein, such a desirable method allows the remaining film part on the substrate to be prepared in a thinner and more uniform manner than the conventional method, and the number of the repeatable transfer times by the stamper per one releasing treatment for the stamper to be greatly increased.

However, as disclosed in Japanese Unexamined Patent Application Publications No. 2012-41521 and No. 2009-158729, the conventional method for improving the mutual adhesion between the resin layer and the substrate has a disadvantage that the adhesion therebetween becomes insufficient when the thickness of the remaining layer becomes thin, which causes the remaining film to be transferred to the stamper.

SUMMARY OF THE INVENTION

Accordingly, an object of the present invention is to provide a method for forming a microfine structure and a microfine structure forming body formed by the method. Herein, the method allows a thickness of a remaining layer on a substrate to be made thinner and more uniform than a conventional method, and the number of repeatable transfer times by a mold (or stamper) per one releasing treatment for the mold (or stamper) to be significantly increased.

A method for forming a microfine structure of the present invention, which realizes the aforementioned object, comprises the steps of: forming a metallic thin film on the substrate; forming an oxide layer on a surface of the metallic thin film; forming a photocurable resin layer on a surface of the oxide layer via an adhesive layer; and transferring a microfine structure formed on a mold by pressing the mold onto the photocurable resin layer, wherein the adhesive layer comprises a first adhesive layer adhering to the surface of the oxide layer and the second adhesive layer adhering to the photocurable resin layer, wherein the first and second adhesive layers respectively comprise a compound having a functional group, wherein the compound of the first adhesive layer has at least two functional groups which form a chemical bond with the surface of the oxide layer or further form a chemical bond to the compound of the second adhesive layer; and the compound of the second adhesive layer has at least a hydrolysable functional group which form a chemical bond with the compound of the first adhesive layer, and a reactive functional group which form a chemical bond with the photocurable resin of the photocurable resin layer.

Further, the microfine structure forming body of the present invention, which realizes the aforementioned object, is obtained by the aforementioned method.

According to the present invention, it is possible to provide a method for forming a microfine structure and a microfine structure forming body formed by the method. Herein, the method allows a thickness of a thin layer (or remaining film part) on a substrate to be made thinner and more uniform than a conventional method, and the number of repeatable transfer times by a mold per one releasing treatment for the mold to significantly increase.

EMBODIMENT FOR CARRYING OUT THE INVENTION

Figure 1A:
FIGS. 1A to 1E show process diagrams illustrating a method for forming a microfine structure according to an embodiment of the present invention.

Next, an embodiment of the present invention will be explained in detail, appropriately referring to the drawings.

The method for forming the microfine structure of the present invention includes the steps of: forming a photocurable resin layer on a surface of an oxide layer formed on a metallic thin film via first and second adhesive layers, and transferring a microfine structure of a mold by pressing the mold onto the photocurable resin layer. The present invention is characterized in that predetermined materials are used as the compounds for respectively forming the first and second adhesive layers used, as described hereinafter.

FIGS. 1A to 1E are schematic views for explaining steps of the method for forming the microfine structure according to the embodiments of the present invention. In the method for forming the microfine structure, the microfine structure forming body A having a microfine structure is formed, in which the microfine structure is obtained by transferring a microfine structure of a mold 7 shown in FIG. 1E. Note a thickness and a width of each layer in FIGS. 1A to 1E are exaggeratingly shown for appropriately illustrating the drawings, whereby the drawings do not show the actual thickness and width thereof. Therefore, the ratio of the thicknesses between the respective layers is shown different from the actual ratio.

The method for forming the microfine structure in the present embodiment comprises the steps of: forming the metallic thin film on the substrate; forming the oxide layer made of the metal oxide on the metallic thin film; forming the photocurable resin layer on the surface of the oxide layer via the adhesive layer; and transferring the microfine structure formed on the mold by pressing the mold onto the photocurable resin layer. Note the microfine structure of the present embodiment may be formed in the range from nm to µm sizes.

<Step of Forming the Metallic Thin Film>

In the method for forming the microfine structure, first the metallic thin film 2 is formed on the surface of the substrate 1 prepared beforehand, as shown in FIG. 1A.

A material of the substrate 1 is not limited and various materials may be used for the substrate 1, for example, including a silicon wafer, various metallic materials, glass, quartz, ceramics, and resins or the like. A shape of the substrate 1 may be planner including, for example, a disk, an oval, or a polygon. Further, the substrate 1 may also be processed as to have a center bore.

Depending on the application, various materials may be used preferably for the metallic thin film 2, including at least one member selected from aluminum, titanium, chromium, cobalt, ruthenium, platinum, tantalum, tungsten, palladium, and an alloy thereof. The metallic thin film 2 may be comprised of a monolayer or multilayers.

Note the microfine structure forming bodies B (refer to FIG. 2E) and D (refer to FIG. 4) formed over the entire metallic thin film 2 described hereinafter may be provided to be used for a wavelength filter, a polarization filter, and an electrode, etc.

The method for forming the metallic thin film. 2 includes, for example, physical vapor deposition or a wet reduction method. From a standpoint of mass productivity, the physical vapor deposition may be preferred as the formation. Herein, the physical vapor deposition includes, for example, a vacuum deposition method, a spattering method, electron beam deposition, and an ion plating method, etc. Among them, the spattering method is most preferable from a standpoint of manufacturing costs.

The thickness of the metallic thin film 2 is preferably in the range from 20 to 200 nm.

<Step of Forming Oxide Layer>

Figure 1B:
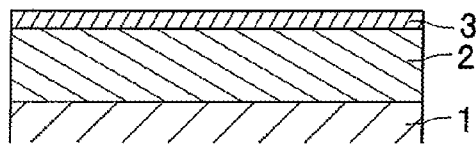

Next, an oxide layer 3 made from the metallic thin film is formed on a surface of the metallic thin film 2, as shown in FIG. 1B.

There is no specific limitation on the method forming the oxide layer 3 as long as the oxide layer can be formed. The method includes deposited film formation methods such as an organometallic vapor deposition method, and an atomic layer deposition method, etc. For example, oxidation treatment methods for the surface of the afore-mentioned metallic thin film 2 such as a thermal anneal treatment method, an ultraviolet treatment method, an O2 plasma treatment method, etc. are preferable due to the simple procedure. The oxide layer 3 preferably has a thickness thereof form 1 to 20 nm.

<Step of Forming Resin Layer>

Figure 1C:
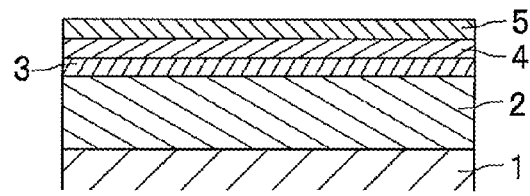
Figure 1D:
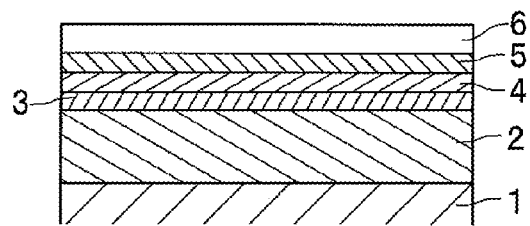

Next, a first adhesive layer 4 is formed on a surface of the oxide layer 3, and subsequently a second adhesive layer 5 is formed on a surface of the first adhesive layer 4 as shown in FIG. 1C. After that, a photocurable resin layer 6 is formed on a surface of the second adhesive layer 5 as shown in FIG. 1D.

The first adhesive layer 4 is formed on the surface of the oxide layer 3 by deposition of a compound for the first adhesive layer, and the second adhesive layer 5 is formed on the surface of the first adhesive layer 4 by deposition of a compound for the second adhesive layer as described hereinafter.

The compound for the first adhesive layer has at least two hydrolysable functional groups in a molecule thereof. The hydrolysable functional groups form a chemical bond with the surface of the oxide layer 3 or further form a chemical bond with the compound for the second adhesive layer.

The compound for the second adhesive layer has a hydrolysable functional group which forms a chemical bond with the compound for the first adhesive layer, and a reactive functional group which forms a chemical bond with a reactive group of a photocurable resin for forming the after-mentioned photocurable resin layer 6 in a molecule thereof.

As the hydrolysable functional groups for those compounds of the first and the second adhesive layers, hydrolysable silyl groups are preferable. Such silyl groups may be mutually the same or different. Further, the reactive functional group of the compound for the second adhesive layer is preferably a reactive silyl group.

As the compound of the first adhesive layer, a compound having at least two hydrolysable silyl groups on a hydrocarbon skeleton thereof is more preferable. Further, as the compound of the second adhesive layer, a compound having at least a hydrolysable silyl group and the above-mentioned reactive silyl group on a hydrocarbon skeleton thereof is more preferable.

As the hydrolysable silyl group, trialkoxysilyl and trichlorosilyl groups are preferable, and specifically trimethoxysilyl and triethoxysilyl groups are more preferable.

As the reactive silyl group, a silyl group comprising a (meth)acryloyl group, a silyl group comprising a a vinylether group, a silyl group comprising an epoxy group, and a silyl group comprising an oxetanyl group are preferable.

As a specific example of the compound for the first adhesive layer, for example, 1,2-bis (triethoxysilyl)ethane, 1,6-bis(trimethylsilyl)hexane, bis[3-tri(methoxysilyl)propyl]amine, 1,4-bis(trimethylsilylethyl)benzene, bis(triethoxysilylpropyl)disulfide, 1,8-bis(triethoxysilyl)octane, a mixture of two or more compounds selected from the above mentioned compounds are included, but not limited to those examples.

As a specific example of the compound for the second adhesive layer, for example, methyl trichlorosilane, methyl tribromosilane, methyl trimethoxysilane, methyl triethoxysilane, methyl triisopropoxysilane, methyl tri-t-buthoxysilane, ethyl trichlorosilane, ethyl tri-isopropoxysilane, ethyl tri-t-buthoxysilane, n-propyl trichlorosilane, n-propyl tribromosilane, n-propyl tri-t-buthoxysilane, n-hexyl trichlorosilane, n-hexyl tribromosilane, n-hexyl trimethoxysilane, n-hexyl triethoxysilane, n-hexyl tri-isopropoxysilane, n-hexyl tri-t-buthoxysilane, n-decyl trichlorosilane, n-decyl tribromosilane, n-decyl trimethoxysilane, n-decyl tri-isopropoxysilane, n-decyl tri-t-buthoxysilane; n-octadecyl trichlorosilane, n-octadecyl trimethoxysilane, n-octadecyl triethoxysilane, n-octadecyl triisopropoxysilane, n-octadecyl tri-t-buthoxysilane, phenyl trichlorosilane, phenyl tribromosilane, phenyl trimethoxysilane, phenyl triethoxysilane, phenyl triisopropoxysilane, phenyl tri-t-buthoxysilane, dimethoxy diethoxysilane, dimethyl dichlorosilane, dimethyl dibromosilane, dimethyl dimethoxysilane, dimethyl diethoxysilane, diphenyl dichlorosilane, diphenyl dibromosilane, diphenyl dimethoxysilane, phenylmethyl dimethoxysilane, phenylmethyl diethoxysilane, trichlorohydrosilane, tribromohydrosilane, trimethoxyhydrosilane, triethoxyhydrosilane, triisopropoxyhydrosilane, tri-t-buthoxyhydrosilane, vinyl trichlorosilane, vinyl tribromosilane, vinyl trimethoxysilane, vinyl triethoxysilane, vinyl tri-isopropoxysilane, vinyl tri-t-buthoxysilane, γ-glysidoxypropylmethyl dimethoxysilane, γ-glysidoxypropylmethyl diethoxysilane, γ-glysidoxypropyl trimethoxysilane, γ-glysidoxypropyl triethoxysilane, γ-glysidoxypropyl triisopropoxysilane, γ-glysidoxypropyl tri-t-buthoxysilane, γ-(meth)acryloxypropylmethyl dimethoxysilane, γ-(meth)acryloxypropylmethyl diethoxysilane, γ-(meta)acryloxypropyl triethoxysilane, γ-(meth)acryloxypropyl triisopropoxysilane, γ-(meth)acryloxypropyl trimethoxysilane, γ-(meth)acryloxypropyl triethoxysilane, γ-(meth)acryloxypropyl tri-t-buthoxysilane, γ-aminopropylmethyl dimethoxysilane, γ-aminopropylmethyl diethoxysilane, γ-aminopropyl trimethoxysilane, γ-aminopropyl triethoxysilane, γ-aminopropyl tri-isopropoxysilane, γ-aminopropyl tri-t-buthoxysilane, γ-mercaptopropylmethyl dimethoxysilane, γ-mercaptopropylmethyl diethoxysilane, γ-mercaptopropyl trimethoxysilane, γ-mercaptopropyl triethoxysilane, γ-mercaptopropyl tri-isopropoxysilane, γ-mercaptopropyl tri-t-buthoxysilane, β-(3,5-epoxycyclohexyl) ethyl trimethoxysilane, β-(3,4-epoxycyclohexyl) ethyltriethoxysilane, and their partially hydrolysates, and a mixture of two or more compounds selected from the above described compounds, but not limited to those examples.

Next, the photocurable resin layer 6 is formed on the surface of the second adhesive layer 5 as shown in FIG. 1D. The photocurable resin layer 6 is formed by applying a photocurable resin composition onto the surface of the adhesive layer 5.

The photocurable resin composition in the present embodiment can be comprised of a photocurable resin and a polymerization initiator, etc.

The photocurable resin is selected from monomers or oligomers comprising a photopolymerisable functional group, such as a (meth)acryloyl group, a vinylether group, an epoxy group, and an oxetanyl group, etc.

As the photocurable resin having a (meth)acryloyl group, for example, poly methyl (meth)acrylate, ethoxylated bisphenol A type acrylate, aliphatic urethane acrylate, polyester acrylate, polyethylene terephthalate, polystyrene, polycarbonate, Modified alicyclic epoxide, bifunctional alcoholether epoxide, acryl silicone, and acryldimethyl siloxane, etc are given.

As the photo-curable resin, not only the following polymers but also the monomers can be used, for example, methoxytriethyleneglycol (meth)acrylate, methoxypolyethleneglycol (meth)acrylate, isoboronyl(meth)acrylate, octoxypolyethyleneglycol (meth)acrylate, 2-hydroxy-3-phenoxypropyl(meth)acrylate, isostearyl(meth)acrylate, raury l (meth)acrylate, polyethyleneglycol di(meth)acrylate, 1,10-decanediol di(meth)acrylate, cyclodecanedimethanol di(meth)acrylate, ethoxylated 2-methyl-1,3-propanedioldi (meth)acrylate, neopentylglycol di(meth)acrylate, 2-hydroxy-3-acryloxypropylacrylate, 1,6-hexanediol di(meth) acrylate, 1,9-nonanediol di(meth)acrylate, dipropyleneglycol diacrylate, tripropyleneglycol di (meth)acrylate, ethyleneglycol di(meth)acrylate, triethyleneglycol di(meth)acrylate, tetraethleneglycol di(meth)acrylate, ethhoxytrimethylol propanetriacrylate, dipentaerythlyrol hexa(meth)acrylate, cyclohexyl(meth)acrylate, cyclopentanyl(meth)acrylate, cyclopentenyl(meth)acrylate, adamantly(meth)acrylate, etc. are given, but not limited thereto.

As an organic component having a vinylether group, ethleneglycol di-vinylether, diethyleneglycol di-vinylether, triethyleneglycol di-vinylether, tetraethyleneglycol di-vinylether, butanediol di-vinylether, hexanediol di-vinylether, cyclohexane di-methanol-di-vinylether, isophtalic acid di(4-vinyroxy)butyl, Di(4-vinyroxy)butyl-tri-methylolpropane tri-vinylether succinate, 2-Hydroxyethyl vinylether, hydroxybutylvinylether, hydroxyhexyl vinylether, vinylsilicone, vinyl silsesquioxane, etc. are given.

As an organic component having a vinyl group, for example, alicyclic epoxide, modified alicyclic epoxide, Bisphenol A type epoxide, hydrogenated Bisphenol A type epoxide, bifunctional alcoholether type epoxide, 1,6-hexanediol glycidyl ether, 1,4-butanediol glycidyl ether, epoxy silsesquioxane, etc. are given.

As an organic component having an oxetanyl group, for example, 3-ethyl-3-hydroxymethyloxetane, 1,4-bis[(3-ethyl-3-oxetanylmethoxy)methyl]benzene, 3-ethyl-3-(phenoxymethyl)oxetane, oxetanylsilsesquioxane, phenol nobolac oxetane, etc. are given.

As a polymerization initiator for polymerizing a (meth)acryloyl group, or a vinylether group, for example, benzyl ketal, α-hydroxyketone, α-aminoketone, acylphosphine oxide, titanocene, oxyphenyl acetate, oxime ester, etc. are given. More specifically, 2,2-dimethoxy-1,2-diphenylethane-1-one, 1-hydroxycyclohexyl-phenyl-ketone, 2-hydroxy-2-methyl-1-phenylpropane-1-one, benzophenone, 1-[4-(2-hydroxyethoxy)-phenyl]-2-hydroxy-2-methyl-1-propane-1-one, 2-methyl-1[4-(methoxythio)phenyl]-2-hydroxy-2-methyl-1-propane-1-one, 2-methyl-1[4-(methylthio)phenyl]-2-morphorinophenylpropane-1-on e, 2-benzyl-2-dimethylamino-1-(4-morphrinophenyl)-butanone-1,2-benzyl-2-dimethylamino-1-(4-morphrinophenyl)propane-1-one, 2-benzyl-2-dimethylamino-1-(4-morphrinophenyl)-butanone-1, bis(2,6-dimethoxybenzoyl)-2,4,4-trimethyl-pentylphosphine oxide, 2-hydroxy-2-methyl-1-phenylpropane-1-one, bis(2,4,6-trimethylbenzoyl)phenylphosphine oxide, etc. are given.

As a polymerization initiator for a polymerizing vinylether group, an epoxy group or an oxetanyl group, a well-known photo polymerization initiator such as an electrophilic reagent which has a cation source and hardens the organic component by light, can be used.

Such a polymerization initiator, for example, an iron-allene complex, an aromatic diazonium salt, an aromatic iodonium salt, an aromatic sulphonium salt, a pyridinium salt, an aluminum complex/a silyl ether, a protonic acid, and a Lewis acid etc. A cationic polymerization initiator which initiates hardening of the photocurable resinous composition by ultraviolet light includes, for example, IRGACURE261 (CIBA-GEIGY LTD.), OPTOMER-SP-150 (ADEKA CO.), OPTOMER-SP-151 (ADEKA CO.), OPTOMER-SP-152 (ADEKA CO.), OPTOMER-SP-170 (ADEKA Co.), OPTOMER-SP-171 (ADEKA CO.), OPTOMER-SP-172 (ADEKA CO.), UVE-1014 (GENERAL ELECTRONIC COMPANY), CD-1012 (SARTOMER COMPANY INC.), SANAID SI-60L (SANSHIN CHEMISTRY INDUSTRY CO., LTD.), SANAID SI-80L (SANSHIN CHEMISTRY INDUSTRY CO., LTD.), SANAID SI-100L (SANSHIN CHEMISTRY INDUSTRY CO., LTD.), SANAID SI-110 (SANSHIN CHEMISTRY INDUSTRY CO., LTD.), SANAID SI-180 (SANSHIN CHEMISTRY INDUSTRY CO., LTD.), CI-2064 (NIPPON SODA CO., LTD.), CI-2639 (NIPPON SODA CO., LTD.), CI-2624 (NIPPON SODA CO., LTD.), CI-2481 (NIPPON SODA CO., LTD.), UVACURE 1590 (DAICEL-UCB CO., LTD.), UVACURE 1591 (DAICEL-UCB CO., LTD.), RHODORSIL PHOTO IN ITIATOR 2074 (RHONE-POULENC S.A.), UVI-6990 (UNION CARBIDE CORPORATION), BBI-103 (MIDORI KAGAKU CO., LTD.), MPI-103 (MIDORI KAGAKU CO., LTD.), TPS-103 (MIDORI KAGAKU CO., LTD.), MDS-103 (MIDORI KAGAKU CO., LTD.), DTS-103 (MIDORI KAGAKU CO., LTD.), NAT-103 (MIDORI KAGAKU CO., LTD.), NDS-103 (MIDORI KAGAKU CO., LTD.), CYRAURE UVI 6990 (UNION CARBIDE CORPORATION) or the like. Those polymerization initiators may be used alone, while the combination of two or more initiators may be also used.

A method for applying a photocurable resin composition onto the surface of the second adhesive layer 5 is not limited to any specific one, for example, a dispense method, a spray method, and a spin coating method, etc. are given. Among these methods, a spin coating method is most preferable.

A thickness of the first adhesive layer 4 is preferably in a range from 0.1 to 10 nm.

A thickness of the second adhesive layer 5 is preferably in a range from 0.1 to 10 nm.

A thickness of the photocurable resin layer 6 is preferably in a range from 20 to 100 nm.

<Step of Transferring>

Figure 1E:
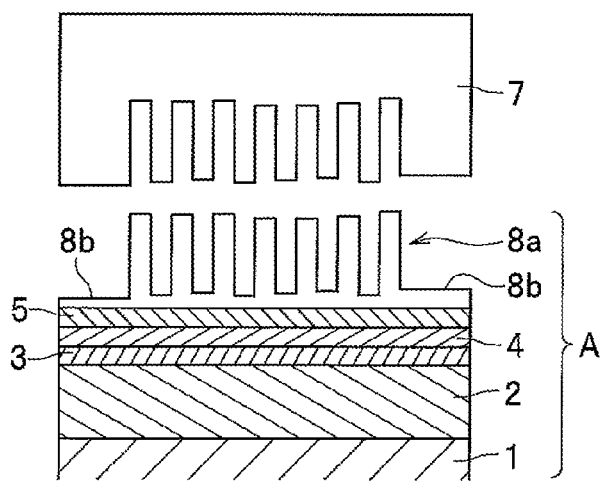

In the transferring step, a microfine structure formed on the mold 7 can be transferred to the photocurable resin layer 6 by pressing the mold 7 onto the photocurable resin layer 6, as shown in FIG. 1E. The microfine structure of the mold 7 is formed by convexes and concaves which are formed in size ranging from nanometer to micrometer dimensions. As a specific example of the microfine structure comprising such convexes and concaves, a dot pattern comprising a plurality of regularly disposed microfine convexes, or conversely a plurality of regularly disposed microfine concaves, and a lamella pattern (or line-and-space pattern) comprising a plurality of regularly disposed stripes, etc. are given.

The method for forming the microfine structure of the mold 7 includes, for example, photolithography, focused ion beam lithography, electron beam lithography, and a nanoimprint process. A proper method may be selected from the above described methods in accordance with the required precision for processing the microfine structure to be formed.

The mold 7 is preferably made of a material which light with desirable wave lengths penetrates so as to harden the photopolymerisable resin composition of forming the photocurable resin layer 6. More specifically, a transparent material such as glass or resin is preferable. In particular, a transparent material having a transmittance in 80% or more of the light with a wavelength of 365 nm is more preferable. These materials may be used as a mono-layer or multi-layers to thereby form the mold 7. Here, a releasing layer may be formed on the surface of the mold 7, in order to promote the releasing of the photocurable resin composition from the surface of the mold 7. As the releasing layer, a material preventing the resin layer from adhering to the surface of the mold 7 is given, including an existing fluorine based material, a silicone material, a hydrocarbon material, a diamond-like carbon material, and a metallic material etc.

In the step of transferring, the photocurable resin layer 6 is exposed to ultra violet light emitted by a light source (not shown) in a direction from the back side of the mold 7 (that is, from the upper side of the drawing in FIG. 1E), in the state that the mold 7 is pressed onto the photocurable resin layer 6. Accordingly, this step allows the photocurable resin layer 6 to be hardened.

Then, the mold 7 is released from the hardened photocurable resin layer 6, thereby to form a microfine structure forming body A to which the microfine structure of the mold 7 has been transferred.

Incidentally, the microfine structure to be formed on the photocurable resin layer 6 is just the inverse of the microfine structure of the mold 7. Therefore, when the pattern with the convexes and the concaves in the microfine structure of the mold 7 is transferred onto the photocurable resin layer 6, the reversed pattern thereof is formed on the resin layer 6 such that the convexes and the concaves of the mold 7 respectively correspond to the concaves and the convexes of the resin layer 6.

As shown in FIG. 1E, the microfine structure transferred onto the photocurable resin layer 6, has a reversed convex and concave pattern corresponding to the concave and convex pattern on the surface of the mold 7. The microfine structure transferred onto the photocurable resin layer 6 is comprised of a remaining film part 8b and a pattern part (or convex part 8a) both of which are made of the photocurable resin and formed on the oxide layer 3. Herein, the remaining film part 8b is composed of the concaves in the convex and concave pattern, while the pattern part (or convex part 8a) is composed of the convexes therein.

The thickness of the remaining film part 8b of the present embodiment may be set in the range from 0.1 to 20 nm. The aspect ratio of a convex in the convex part 8a (i.e. height of the convex in the convex part 8a/width of the convex in the convex part 8a) may be set in the range from about 0.5 to about 3.

The thickness of the remaining film part 8b is preferably set within 30% of the height of the convex in the convex part 8a.

Next, effects of the method for forming the microfine structure of the present embodiment will be described.

In the step of forming the resin layer in the method for forming the microfine structure of the present embodiment, the oxide layer 3 and the photocurable resin layer 6 are stacked via the first adhesive layer 4 and the second adhesive layer 5.

In this process, a compound for the first adhesive layer, the compound forming the first adhesive layer 4, has at least two hydrolysable functional groups so as to form a chemical bonding with the surface of the oxide layer 3 or further form a chemical bond with a compound for the second adhesive layer, the compound forming the second adhesive layer 5. Accordingly, the first adhesive layer 4 adheres strongly to the surface of the oxide layer 3, since the hydrolysable functional group of the compound for the first adhesive layer forms a chemical bond with a reactive end group on the surface of the oxide layer 3.

The compound for the second adhesive layer reacts with the surface of the first adhesive layer 4 strongly adhering to the surface of the oxide layer 3. Hereby, the hydrolysable functional group forming no chemical bond with the reactive end group of the oxide layer 3, among at least the two hydrolysable groups of the compound for the first adhesive layer forms a chemical bond with the hydrolysable functional group of the compound for the second adhesive layer. This allows the second adhesive layer 5 to adhere strongly to the surface of the first adhesive layer 4.

When the photocurable resin layer 6 is formed on the surface of the second adhesive layer 5, a reactive functional group of the second adhesive layer 5 forms a chemical bond with a reactive functional group of the photocurable resin in the photocurable resin layer 6. Consequently, the photocurable resin layer 6 can strongly adhere to the surface of the second adhesive layer 5.

On the other hand, in the conventional imprint method (for example, refer to Japanese Unexamined Patent Application Publication No. 2009-158729), an adhesive layer functions as an adhesive promoting layer in a photocurable resin layer, in which the adhesive layer consists of a monolayer made from, for example a silane coupling agent having the same structural feature as the compound for the second adhesive layer of the present embodiment.

Thus, a hydrolysable functional group of the silane coupling agent forms a chemical bond with an inorganic end of the substrate etc., while a reactive functional group of the silane coupling agent form a chemical bond with the photocurable resin layer.

Molecules in the conventional silane coupling agent bonding with the inorganic end do not have uniform orientation in a longitudinal molecule direction. This feature restricts the bonding density between the photocurable resin layer and the reactive functional groups.

On the other hand, in this embodiment, the compound for the first adhesive layer intervenes between the inorganic side (that is, oxide layer 3 side) and the compound for the second adhesive layer. This may increase the degree of freedom for forming a chemical bond between the reactive functional group in the compound for the second adhesive layer and the photocurable resin layer 6. The above concept may explain the fact that the adhesion force of the photocurable resin layer 6 is more greatly improved than the prior art, as describes in bellow by having the first adhesive layer 4 and the second adhesive layer 5 as the adhesive layer in the present invention.

As mentioned above, according to the present embodiment, adhesive force between the oxide layer 3 and the photocurable resin layer can be particularly enhanced. Hereby, in this embodiment, the thickness of the remaining film layer 8b can be formed in a thinner and more uniform manner than that of the prior art. Further, the number of repeatable transfer times onto the mold 7 per one treatment with the releasing agent can be more increased.

Note the present invention may be performed by various embodiments herein without limiting to the above described embodiment.

Hereinbefore, the formation method for the microfine structure forming body A shown in FIG. 1E has been described in the above embodiment. However, in the present invention, etching may be further performed until any one of the layers from the second adhesive layer 5 to the substrate 1 is etched by using the convex part of the microfine structure forming body A as an etching mask.

Figure 2A:
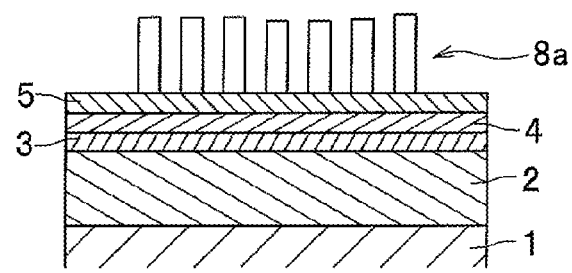
FIGS. 2A to 2E show process diagrams illustrating a variation of the method for forming the microfine structure according to the embodiment of the present invention.
Figure 2B:
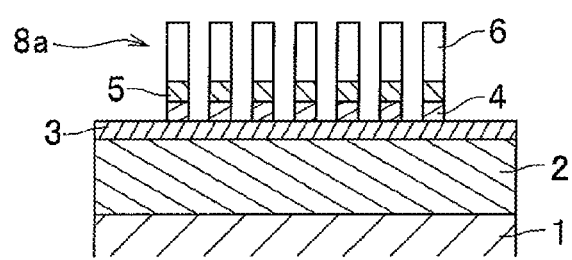
Figure 2C:
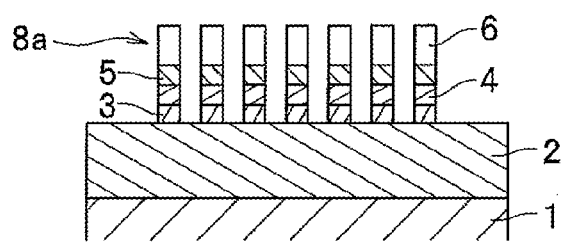
Figure 2D:
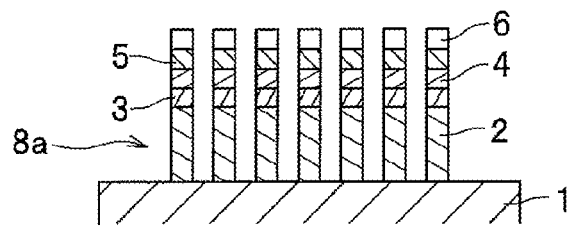
Figure 2E:
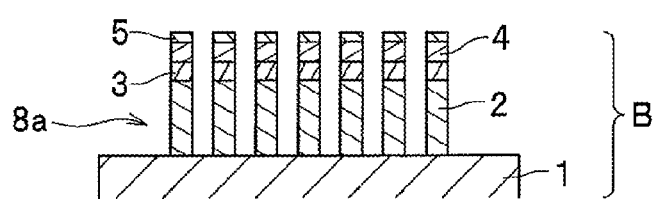

FIGS. 2A to 2E illustrate the steps in a variation example of the method for forming the microfine structure of the present embodiment. In this method for forming the microfine structure, a microfine structure forming body B shown in FIG. 2E is formed using the microfine structure forming body A shown in FIG. 1E as a raw material. Note a thickness and a width of each layer in FIGS. 2A to 2E are exaggeratedly shown for illustrative convenience.

Therefore, the thickness and the width of each layer in the drawings do not represent an actual thickness and width thereof. Further, a ratio between thicknesses of the respective layers in the drawings is shown in different from the actual ratio.

In the present method for forming the microfine structure, the microfine structure forming body A shown in FIG. 1E is etched to remove the remaining film part 8b, whereby a surface of the second adhesive layer 5 is exposed. In that step, a part of the convex part 8a is removed along with the remaining film part 8b, since both of the remaining film part 8b and the photocurable resin layer 6 comprising the convex part 8a of the microfine structure forming body A are etched in the same rate.

Next, as shown in FIG. 2B, a surface of the oxide layer 3 becomes exposed by etching the second adhesive layer 5 and the first adhesive layer 4 by using the concave part 8a of the photocurable resin layer 6 as an etching mask. Herein, each width of the etched portions is equal to each width between the corresponding adjacent convexes of the convex part 8a. Thereby, a part of the first adhesive layer, the second adhesive layer 5 and the photocurable resin layer 6 remains on the surface of the oxide layer 3, whereby a new convex part 8a is formed thereon.

Then, a surface of the metallic thin film 2 becomes exposed by etching the oxide layer 3 in the widths between the adjacent convexes of the new convex part 8a.

After that, the surface of the substrate 1 is exposed by etching of the metallic thin film 2 in the widths between the adjacent convexes of a newly created convex part 8a. Thereby, a part of the metallic thin film 2, the oxide layer 3, the first adhesive layer 4, the second adhesive layer 5 and the photocurable resin layer 6 remains on the surface of the substrate 1, whereby a new convex part 8a is formed thereon.

Accordingly, the photocurable resin layer 6 included in the convex part 8a of FIG. 2D is removed, whereby the steps of preparing the microfine structure forming body B are completed as shown in FIG. 2E.

Alternatively, in the method of the present embodiment, a microfine structure forming body may be prepared by using the convex part 8a shown in FIG. D, or the convex part 8a of the microfine structure forming body B shown in FIG. 2E as an etching mask, and then by etching the substrate 1 in the widths of the adjacent convexes in the convex part 8a.

Figure 3:
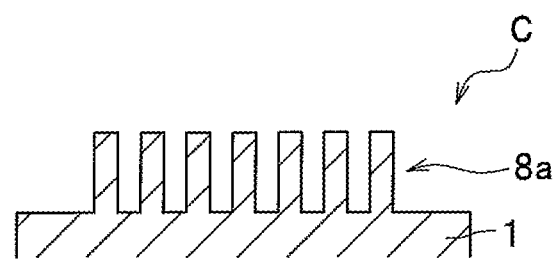
FIG. 3 shows a schematic diagram illustrating an example of the microfine structure forming body formed by the method for forming the microfine structure according to the embodiment of the present invention.

FIG. 3 is a schematic diagram of an example illustrating a microfine structure forming body prepared by the method for forming the microfine structure in an embodiment of the present invention. Note a thickness and a width of each layer in FIG. 3 are exaggeratedly shown for illustrative convenience. Therefore, the thickness and the width of each layer in the drawing do not represent an actual thickness and width thereof. Further, a ratio between thicknesses of the respective layers in the drawing is shown in different from the actual ratio As shown in FIG. 3, the microfine structure forming body C in which a pattern part (or convex part 8a) is formed on a surface of the substrate 1 is obtained by etching the substrate 1 by using a convex part 8a shown in FIG. 2D or a convex part 8a of a microfine structure forming body B shown in FIG. 2E as an etching mask in the widths of the adjacent convexes in the convex part 8a.

Here, the pattern parts (or convex parts 8a) including different layers may be formed through the method for preparing the microfine structure forming body A via conducting the steps shown in FIGS. 1A to 1E, and the method for preparing the microfine structure forming body B via conducting the steps shown in FIGS. 2A to 2E. Further, it should be noted that the above mentioned pattern parts (or convex parts 8a) thus obtained may be processed respectively.

Figure 4:
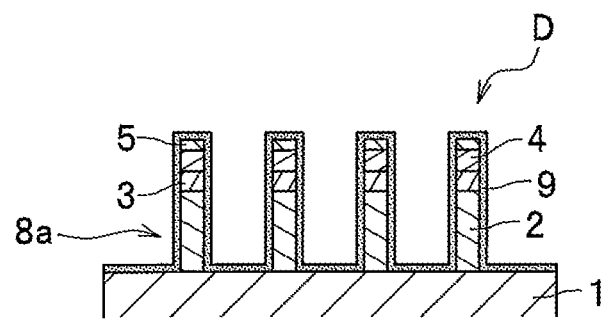
FIG. 4 shows a schematic diagram illustrating another example of the microfine structure forming body formed by the method for forming the microfine structure according to the embodiment of the present invention.

FIG. 4 is a schematic diagram of an example illustrating a microfine structure forming body prepared by the method for forming the microfine structure in an embodiment of the present invention. Note a thickness and a width of each layer in FIG. 4 are exaggeratedly shown for illustrative convenience. Therefore, the thickness and the width of each layer in the drawing do not represent an actual thickness and width thereof. Further, a ratio between thicknesses of the respective layers in the drawing is shown in different from the actual ratio.

As shown in FIG. 4, a microfine structure forming body D is prepared by further treating one of the convex parts 8a obtained in the same method as for the microfine structure forming body B prepared via the steps shown in FIGS. 2A to 2E, and the concave part on the substrate 1. More specifically, the anticorrosion layer 9a is provided with the surface of the convex part 8a which is comprised of the metallic film layer 2, the oxide layer 3, the first adhesive layer 4 and a part of the second adhesive layer 5, and the surface of the concave part, both formed on the surface of the substrate 1 (refer to FIG. 2E). As the anticorrosion layer 9, for example, a cover layer made from a silane coupling agent etc. is given.

The microfine structure forming body of the present invention is applicable to an information storage medium such as a magnetic storage medium and an optical storage medium. The microfine structure forming body is also applicable to a component of a large scale integrated circuit, an optical component such as a lens, a polarizing plate, a wavelength filter, a light emitting device and an optical integrated circuit, and a bio device used in, for example, an immunoassay, a DNA separation, and a cell culture system, etc.

EXAMPLES

Next, the present invention will be described more specifically in reference to examples.

Example 1

In this EXAMPLE 1, the microfine structure forming bodies A and B were prepared by performing the steps shown in FIGS. 1A to 1E and FIGS. 2A to 2E.
<Preparation of Microfine Structure Forming Body A>

As shown in FIG. A, the metallic thin film 2 consisting of aluminum (thickness of 150 nm) was deposited on the surface of the substrate 1 (a synthetic quartz substrate: diameter of 100 mm, thickness of 0.7 mm) by a spattering method.

Next, as shown in FIG. 1B, the oxide layer 3 (thickness of 6 nm) was formed on the surface of the metallic thin film 2 by an $O_2$ plasma treatment method.

As shown in FIG. 1C, the first adhesive layer 4 was first deposited on the surface of the oxide layer 3 by a vapor deposition method via using bis(triethoxysilylpropyl)-disulfide (Wako Pure Chemical Co. Ltd.). Next, on the surface of the first adhesive layer 4 thus obtained, the second adhesive layer 5 was deposited by a vapor deposition method via using γ-glycidoxypropyl-trimethoxysilane (Tokyo Chemical Industry Co., Ltd.)

Next, as shown in FIG. 1D, the photocurable resin layer 6 including ethylene glycol divinyl ether as a main component thereof was formed on the surface of the second adhesive layer 5 in the thickness of 50±2 nm by a spin coating method.

Then, as shown in FIG. 1E, the microfine structure forming body A was formed by transferring the microfine structure of the mold 7 onto the photocurable resin layer 6. As the mold 7, a quartz glass disk provided with a line-and-space pattern (that is, microfine structure) was used. The pattern had a full pitch of 150 nm, a land pitch of 90 nm, and a height of 90 nm, formed on the entire circular surface with a 100 mm diameter on the surface of the quartz glass disk with a diameter Φ of 150 mm and a thickness of 0.7 mm. Note, the line-and-space pattern was directly drawn on the quartz glass disk by an electron beam lithography method.

Note a releasing treatment was performed for the surface of the mold 7 on which the microfine structure was formed by using a releasing agent such as perfluoropolyether.

Then, in the state that the mold 7 was pressed on the photocurable resin layer 6, ultraviolet light was irradiated to the photocurable resin layer from the back side of the mold 7, thereby to harden the photocurable resin layer 6. After that, the mold 7 was released from the photocured resin layer 6 (refer to FIG. 1E), whereby the aforementioned microfine structure forming body A was obtained.

A part of a resin structure on the surface of the microfine structure forming body A was scraped off, and then a height of the pattern part (or convex part 8a) and a thickness of the remaining film part 8b were measured by an AFM (Atomic Force Microscope). Accordingly, the height of the pattern part (or convex part 8a) was 87±2 nm, and the thickness of the remaining film part 8b was 8±4 nm.
<Preparation of Microfine Structure Forming Body B>

As shown in FIGS. 2A and 2B, the microfine structure forming body A shown in FIG. 1E was etched, thereby to expose the surface of the oxide layer 3 (refer to FIG. 2B). Note the etching was conducted using oxygen gas at the precalculated etching rate.

Next, the oxide layer 3 was etched, thereby to expose the surface of the metallic thin film 2 using chlorine type gas, as shown in FIG. 2C.

Then, the metal thin layer was etched using different chlorine type gas from the chlorine type gas used in the former step. As shown in FIG. 2D, by exposing the surface of the substrate 1, a convex part comprising the metallic thin film 2, the oxide layer 3, the first adhesive layer 4, the second adhesive layer 5, and the photocurable resin layer 6 stacked in this order from the upper side of the substrate 1. The height of the convex part was 5 nm.

Next, as shown in FIG. 2E, the microfine structure forming B was prepared by etching with nitrogen based gas to remove every part of the photocurable resin layer 6 of the convex part shown in FIG. 2D.

Then, a cross sectional surface of the microfine structure forming body B was measured at several points by a SEM (scanning electron microscope). Hereby, it was determined that a line-and-space pattern mainly made of aluminum was formed on the substrate 1. Herein, the pattern had a full pitch of 150±1 nm, a land pitch of 89±5 nm, and a height of 150±1 nm.

Note the rate of defects in the line-and-space pattern was less than 1% within a circular area with a 100 mm diameter in the microfine structure forming body B.

Further, a cross sectional surface of the microfine structure forming body B was measured by a TEM (transmission electron microscope). Hereby it was determined that the thickness of the oxide layer 3 in the convex part was thicker than that of the spontaneously oxidized film which was formed on the lateral side of the convex part made of aluminum.

Moreover, the contents of silicon in the first adhesive layer 4 and the second adhesive layer 5 in the convex part and the contents of silicon in the bottom of the concave part of the microfine structure forming body B were measured to be compared. Accordingly, it was determined that the contents of silicon in the convex part were larger than the contents of silicon in the bottom.
<Evaluation of Adhesion Force of Adhesive Layers>

The transfer steps (refer to FIG. 1E) of the mold 7 on the photocurable resin layers 6 were repeatedly performed one hundred times without conducting any further releasing treatment for the mold 7. Accordingly, 100 microfine structure forming bodies A were totally prepared. Further, the steps from FIGS. 2A to 2E were performed for each of the resulting 100 microfine structure forming bodies A, thereby to prepare a total of 100 microfine structure forming bodies B.

As mentioned above, the microfine structure formed on a microfine structure forming body B firstly prepared had a line-and-space pattern mainly formed of a full-pitch of 150±1 nm, a land-pitch of 89±5 nm, and a height of 150±1 nm. The microfine structure formed on a microfine structure forming body B secondly prepared had a line-and-space pattern mainly formed of a full-pitch of 150±1 nm, a land-pitch of 88±4 nm, and a height of 150±1 nm. Both of the microfine structures were formed almost in the same accuracy.

A pattern on the one-hundredth microfine structure forming body A prepared had a height of 88±2 nm at the pattern part (or convex part 8a), and a thickness of 5±5 nm at a remaining film part 8b. Note the defect rate in the pattern was less than 1% within a circular area with a 100 mm diameter in the one-hundredth microfine structure forming body B.

According to the preparation method of the present example, almost the same accuracy was achieved between the microfine structure forming bodies A and B prepared at the first transfer and the microfine structure forming bodies A and B prepared at the one-hundredth transfer by the mold 7.

Hereby, the adhesion force of the photocurable resin layer 6 onto the oxide layer 3 was determined to be extremely strong due to the cooperative effect of the first adhesive layer 4 and the second adhesive layer 5.

Example 2

In this EXAMPLE 2, bis-triethoxysilylethane (Tokyo Chemical Industries, Co. Ltd.) was used for the first adhesive layer 4, and 3-acryloylpropyltrimethoxysilane (Shin-etsu silicone Co. Ltd.) was used for the second adhesive layer 5, as shown in FIG. 1C.

Further, the photocurable resin layer 6 was formed by using an acrylate mixture of which main component was neopentylglycol diacrylate (Shin-Nakamura Chemical Industries Co. Ltd.).

Except for the above mentioned differences, totally 100 microfine structure forming bodies A and B were respectively prepared in the same method as in EXAMPLE 1.

The first microfine structure forming body A had a height of 84±2 nm at the pattern part (or convex part 8a) and a thickness of 7±3 nm at the remaining film part 8b. The first microfine structure forming body B had a full-pitch of 150±1 nm, a land-pitch of 88±5 nm, and a height of 150±1 nm. Within a circular area of a 100 mm diameter in the first microfine forming body structure B, a defect rate of the microfine structure was less than 1%.

The one-hundredth microfine structure forming body A had a height of 85±2 nm at the pattern part (or convex part 8a) and a thickness of 6±2 nm at the remaining film part 8b. The one-hundredth microfine structure forming body B had a full-pitch of 150±1 nm, a land-pitch of 87±6 nm, and a height of 150±1 nm. Within a circular area with a 100 mm diameter in the one-hundredth microfine structure forming body B, a defect rate of the microfine structure was less than 1%.

Accordingly, the microfine structures were formed in the same accuracy between the first microfine structure forming bodies A and B and the one-hundredth microfine structure forming bodies A and B.

Accordingly, the adhesion force of the photocurable resin layer 6 toward the oxide layer 3 was determined to be extremely strong by cooperation effects of the first adhesive layer 4 and the second adhesive layer 5.

Example 3

In this EXAMPLE 3, a microfine structure forming body C forming a microfine structure on the substrate 1 (shown in FIG. 3) was prepared by etching the microfine structure forming body B (refer to FIG. 2E) prepared in EXAMPLE. 1 using fluorine based gas.

A cross sectional surface of the microfine structure forming body C was measured at several points by a SEM (scanning electron microscope). Hereby, it was determined that a line-and-space pattern made of glass was formed, having a full pitch of 150±1 nm, a land pitch of 88±6 nm, and a height of 100±1 nm.

Note a defect rate of the line-and-space pattern within a circular area having a 100 mm diameter in the microfine structure forming body B was less than 1%.

Example 4

In this EXAMPLE 4, on the whole surface of the microfine structure forming body B prepared in the same method as in Example 1, an anticorrosion layer 9 comprising a silane coupling agent was formed, whereby a microfine structure formation D was prepared.

Estimation on the polarization property of the microfine structure formation D demonstrated that the transmittance of the P polarized light was 91% and transmittance of the S polarized light was 0.1%.

Example 5

In this EXAMPLE 5, the oxide layer 3 shown in FIG. 1B was formed in the same method as in Example 1 except that a tungsten thin film was formed as a metallic thin film 2 as shown in FIG. 1A and then an oxidation treatment was conducted to the surface of the tungsten thin film, whereby 100 microfine structure forming bodies A and B were respectively prepared.

The first microfine structure forming body A had a height of 94±2 nm at the pattern part (or convex part 8a) and a thickness of 7±4 nm at the remaining film part 8b. The first microfine structure forming body B had a full-pitch of 135±1 nm, a land-pitch of 45±2 nm, and a height of 145±2 nm. Within a circular area having a 100 mm diameter in the first microfine structure forming body B, a defect rate of the microfine structure was less than 1%.

The 100th microfine structure forming body A had a height of 95±2 nm at the pattern part (or convex part 8a) and a thickness of 8±4 nm at the remaining film part 8b. The 100th microfine structure forming body B had a full-pitch of 135±1 nm, a land-pitch of 45±2 nm, and a height of 145±2 nm. Within a circular area having a 100 mm diameter in the 100th microfine structure forming body B, a defect rate of the microfine structure was less than 1%.

That is, the first microfine structure forming bodies A and B and the one hundredth microfine structure forming bodies A and B were formed in the same accuracy.

Accordingly, the adhesion force of the photocurable resin layer 6 toward the oxide layer 3 was determined to be extremely strong due to cooperation effects of the first adhesive layer 4 and the second adhesive layer 5.

COMPARATIVE EXAMPLES

Comparative Example 1

In this COMPARATIVE EXAMPLE 1, an identical second adhesive layer 5 to that in Example 1 was directly formed on the surface of the oxide layer 3, without forming the first adhesive layer 4 shown in FIG. 1C.

The first microfine structure forming body A was prepared in the same accuracy as in Example 1. However, the 30th microfine structure forming body A had a drawback that a part of the resulting microfine structure forming body A adhered to a surface of the mold 7 in the transfer step. Thereby, a defect rate of the line-and-space pattern was 3% within a circular having a 100 mm diameter in the microfine structure forming body A. Further, a defect rate of the line-and-space pattern was 7% within a similar area in the 50th microfine structure forming body A.

In this COMPARATIVE EXAMPLE 1, the construction of the resulting microfine structure was almost the same as that obtained by the conventional nanoimprint method, since only the second adhesive layer 5 was used therein (for example, refer to Japanese Unexamined Patent Application Publication No. 2009-158729).

That is, it was determined that according to the construction in the prior art, if a thickness of the remaining film part 8b became thinner, the adhesion force of the photocurable resin layer toward the oxide layer became more insufficient, whereby the photocurable resin layer was more easily removed.

Comparative Example 2

In this COMPARATIVE EXAMPLE 2, the first adhesive layer 4 shown in FIG. 1C was only formed on the surface of the oxide layer 3 in the same method as in Example 1, and then a photocurable resin layer 6 was directly formed on the surface of the first adhesive layer 4 without forming the second adhesive layer 5. Except for the above mentioned difference, a microfine structure forming body A was tried to be prepared similarly to EXAMPLE 1. However, in the transfer step shown in FIG. 1E, a part of the photocurable resin layer 6 adhered to and remained on the mold 7, when the hardened photocurable resin layer 6 was separated from the mold 7.

This result may suggest that the adhesion force of the disulfide part of bis (triethoxysilylpropyl) disulfide used as a compound for the first adhesive layer toward the photocurable resin layer is not sufficiently strong.

Comparative Example 3

In this COMPARATIVE EXAMPLE 3, microfine structure forming bodies A and B were prepared respectively in the same method as in EXAMPLE 1 except that the thickness of the photocurable resin layer 6 shown in FIG. 1D was 200±3 nm.

Although the defective rate of the line-and-space pattern was less than 1% within each circular area having a 100 mm diameter in the first to one-hundredth microfine structure A. However, every microfine structure forming A had a thickness of 50 nm or more in the remaining film part 8b. Further, when a microfine structure forming body B was prepared by etching each microfine structure forming body A obtained in the same method as in Example 1, the defect rate of the microfine structure within a circular area having a 100 mm diameter in the microfine structure forming body B was 50% or more.

That is, the transferring accuracy of the microfine structure of the mold 7 to the microfine structure forming body B was determined to be seriously deteriorated, if the remaining film part 8b became too thick.

Comparative Example 4

In this COMPARATIVE EXAMPLE 4, the microfine structure forming bodies A and B were prepared in the same method as in EXAMPLE 1 except that the first adhesive layer 4 shown in FIG. 1C was not formed similarly to COMPARATIVE EXAMPLE 1, the same second adhesive layer 5 as in EXAMPLE 1 was directly formed on the surface of the oxide layer 3, and the thickness of the photocurable resin layer 6 shown in FIG. 1D was 200±5 nm similarly to COMPARATIVE EXAMPLE 3.

Although the defect rate of f the line-and-space pattern was almost 1% within each area having a 100 mm diameter in the first to one-hundredth microfine structure forming body A. However, every microfine structure forming body A was formed with the remaining film part 8b having a thickness of 50 nm or more. Then, a microfine structure forming body B was prepared by etching the microfine structure forming body A thus obtained in the same method as in EXAMPLE 1. Hereby, the defect rate of the microfine structure within a circular area having a 100 mm diameter in the microfine structure forming body B was 50% or more.

That is, the transferring accuracy of the microfine structure of the mold 7 to the photocurable resin layer 6 was determined to be markedly deteriorated, if the remaining film part 8b was too thick, even though the predetermined adhesion force of the photocurable resin layer 6 was exerted only by the second adhesive layer 5.

What is claimed is:

1. A method for forming a microfine structure comprising the steps of:
   forming a metallic thin film on a substrate;
   forming an oxide layer made from the metal on a surface of the metallic thin film;
   forming a photocurable resin layer on a surface of the oxide layer via an adhesive layer; and
   transferring a microfine structure formed on a mold by pressing the mold onto the photocurable resin layer,
   wherein
   the adhesive layer comprises a first adhesive layer for adhering to a surface of the oxide layer and a second adhesive layer for adhering to the photocurable resin layer;
   each of the first and second adhesive layers comprises a compound having functional groups;
   the compound for the first adhesive layer has at least two hydrolysable functional groups forming a chemical bond with the surface of the oxide layer or further forming a chemical bond with the compound for the second adhesive layer; and
   the compound for the second adhesive layer has at least a hydrolysable functional group for forming a chemical bond with the compound for the first adhesive and a reactive functional group for forming a chemical bond with a photocurable resin of the photocurable resin layer.

2. The method for forming a microfine structure as described in claim 1,
   wherein
   a remaining film part and a pattern part are formed in the transferring step: the remaining film part being made of the photocurable resin to be formed on the oxide layer and consisting of convexes of a convex and concave pattern which is transferred onto the photocurable resin layer corresponding to a microfine structure with a convex and concave pattern of the mold, and the pattern part being made of the photocurable resin to be formed on the oxide layer and consisting of concaves of the concave and convex pattern;
   the method further includes steps after the transferring step is completed, comprised of:
   a first etching step in which the remaining film part at the convexes in the convex and concave pattern so as to partially expose the second adhesive layer corresponding to the concaves;

a second etching step which is subsequently conducted after the first etching step so as to partially expose the metallic film layer corresponding to the concaves of the convex and concave pattern by etching the exposed second adhesive layer, the first adhesive layer and the oxide layer in the order; and a third etching step which is subsequently conducted after the second etching step so as to form a microfine structure by partially etching the metallic layer corresponding to the concaves of the convex and concave pattern.

3. The microfine structure forming body prepared by the method for forming a microfine structure as described in claim 2, wherein
the convex of the microfine structure formed in the third etching step comprises at least the metallic thin film and the oxide layer in the order from the surface of the substrate;
a spontaneously oxidized metallic film is formed on a convex of the metallic thin film, and on a concave bottom of the metallic thin film, the concave bottom being formed on the metallic thin film in the third etching step; and
a thickness of the oxide layer at the convex is larger than the spontaneously oxidized metallic film.

4. The method for forming a microfine structure as described in claim 1, wherein
the hydrolysable functional group is a trialkoxysilyl group.

5. The microfine structure forming body prepared by the method for forming a microfine structure as described in claim 4,
wherein
each of the convexes of the microfine structure formed in the third etching step comprises at least the metallic thin film, the oxide film and the adhesion layer in the order from the substrate; and
a silicon content in the convexes of the adhesion layer is larger than a silicon content in the metallic thin film at the convexes and in the metallic thin film at the concave bottoms formed on the metallic thin film in the third etching step.

6. The method for forming a microfine structure as described in claim 1, wherein
a thickness of the metallic thin film is in the range from 20 to 200 nm.

7. The method for forming a microfine structure as described in claim 1, wherein
a thickness of the oxide layer is in the range from 1 to 20 nm.

8. A microfine structure forming body prepared by the method for forming a microfine structure as described in claim 1.

* * * * *